United States Patent [19]
Yamazaki

[11] Patent Number: 5,955,745
[45] Date of Patent: Sep. 21, 1999

[54] SEMICONDUCTOR DEVICE HAVING SIGE SPACER UNDER AN ACTIVE LAYER

[75] Inventor: Toru Yamazaki, Tokyo, Japan

[73] Assignee: NEC Corporation, Tokyo, Japan

[21] Appl. No.: 08/716,032

[22] Filed: Sep. 19, 1996

[30] Foreign Application Priority Data

Sep. 29, 1995 [JP] Japan .................................... 7-253247

[51] Int. Cl.$^6$ .................................................. H01L 29/76
[52] U.S. Cl. .............................. 257/63; 257/65; 257/616
[58] Field of Search .............................. 257/63, 65, 192, 257/197, 198, 378, 553, 555, 556, 558, 591–593, 616; 438/312, 314, 317, 318

[56] References Cited

U.S. PATENT DOCUMENTS

| | | | |
|---|---|---|---|
| 4,825,269 | 4/1989 | Plummer et al. | 257/63 |
| 5,285,088 | 2/1994 | Sato et al. | 257/200 |
| 5,352,912 | 10/1994 | Crabbe et al. | 257/197 |
| 5,461,243 | 10/1995 | Ek et al. | 257/347 |
| 5,633,179 | 5/1997 | Kamins et al. | 438/318 |
| 5,821,577 | 10/1998 | Crabbe et al. | 257/288 |

FOREIGN PATENT DOCUMENTS 2-191341  7/1990  Japan .............................. H01L 29/78

OTHER PUBLICATIONS

"Very High Speed Bipolar Device"; Minoru Nagata; Baifu-kan; pp. 58–59; date unknown.

"Optimization of SiGe HBT Technology for High Speed Analog and Mixed-Signal Application"; Harame et al; International Electron Device Meeting, IEDM Tech. Dig., Dec. 5–8, 1993; pp. 71–74.

Primary Examiner—Fetsum Abraham
Attorney, Agent, or Firm—Hayes Soloway Hennessey Grossman & Hage PC

[57] ABSTRACT

A semiconductor device which does not allow production of leak current or a drop of the Early voltage and includes a diffused layer having a reduced depth. A silicon layer containing an impurity of a second conduction type is formed on a semiconductor substrate of a first conduction type, and a spacer layer formed from a single crystalline silicon layer containing germanium is provided under the silicon layer.

17 Claims, 10 Drawing Sheets

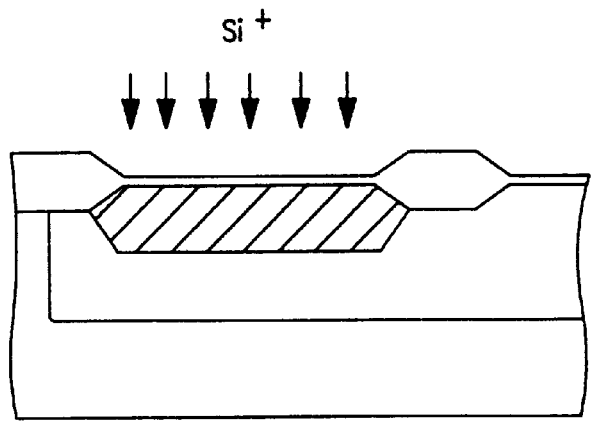
FIG. IA
PRIOR ART
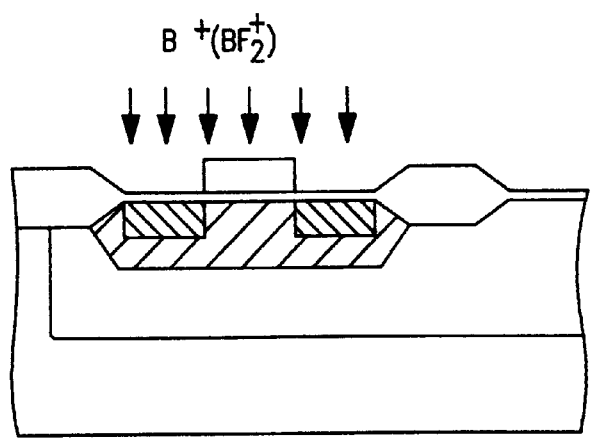
FIG. IB
PRIOR ART

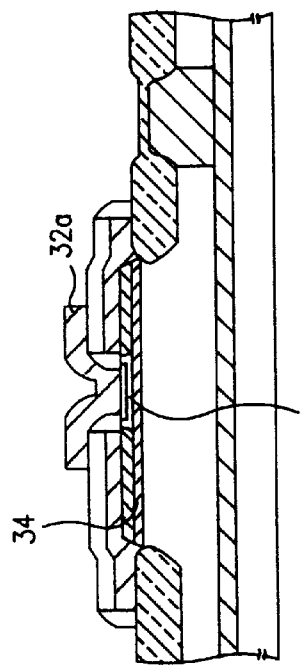
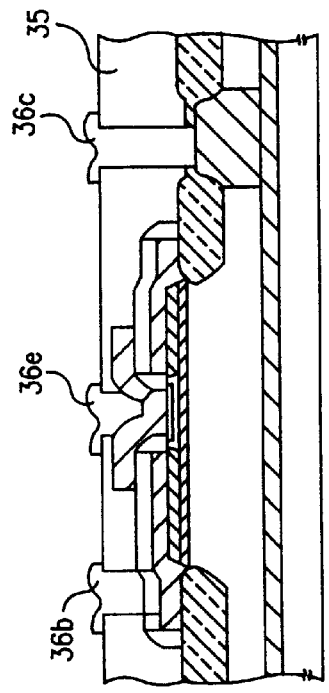
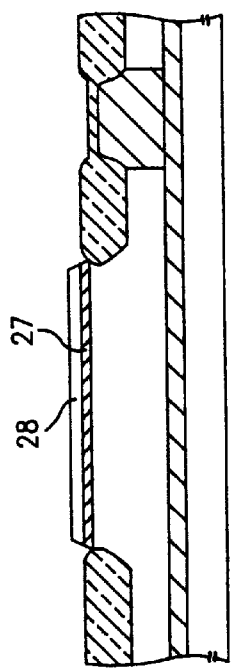
FIG. 12A
FIG. 12B
FIG. 12C
FIG. 12D
FIG. 12E

SEMICONDUCTOR DEVICE HAVING SIGE SPACER UNDER AN ACTIVE LAYER

BACKGROUND OF THE INVENTION

1. Field of the Invention

This invention relates to a semiconductor device such as a bipolar transistor or a MOS transistor which has a silicon layer containing an N-type (P-type) impurity on a P-type (N-type) semiconductor substrate and a method of producing the semiconductor device.

2. Description of the Prior Art

A method of reducing the junction depth of a source drain region which is a diffused layer region in order to improve the short channel effect provided by reduction of the gate length of a MOS transistor is known popularly. Conventionally, ion implantation is used for formation of a diffused layer region, and in order to form an n+ diffused layer, ion implantation of arsenic or phosphor is performed, but in order to form a p+ diffused layer, ion implantation of boron or $BF_2$ is performed.

In order to form a source drain of a comparatively small junction depth, the following points are important:

(1) to minimize the implantation energy;

(2) to set the temperature in heat treatment in the production process after the implantation as low as possible so that the ion-implanted impurity may be diffused as little as possible; and (3) to prevent a channeling phenomenon which makes an obstacle to formation of a shallow junction.

Here, the channeling phenomenon mentioned in the third point above is a phenomenon wherein, when impurity ions are implanted into silicon single crystal, they travel deeply into the silicon single crystal passing through gaps in the atomic configuration. This channeling phenomenon appears remarkably particularly where ions of a low mass number such as boron ions are employed. In this instance, even if ion implantation is performed with low energy, it is very difficult to form a shallow p+ diffused layer.

Several attempts have been proposed to prevent the channeling phenomenon. For example, in Japanese Patent Laid-Open No. Hei 2-191341, it is disclosed that ions of Si+ or Ge+ are first implanted into a transistor formation region to form an amorphous region as seen in FIG. 1(a) and then ions of B+ ($BF_2$+) are implanted into the amorphous region to form a source drain diffused layer as seen in FIG. 1(b) to prevent channeling in vertical and horizontal directions involved in formation of a source drain diffused layer.

On the other hand, in a silicon bipolar transistor, a base diffused layer is conventionally formed by ion implantation, and in order to form a shallow base diffused layer, a method wherein the implantation energy is set low or another method wherein $BF_2$ ions or like ions having a high mass number are used is taken. However, even where those methods are employed, since a channeling phenomenon still appears similarly as in the case of a MOS transistor described above, a tail portion which exhibits a lower impurity concentration is formed on the bottom face of the base diffused layer as seen in FIG. 2(a). Consequently, it is difficult to make the base junction depth shallow.

It is to be noted that a method of forming an epitaxial base layer using an MBE (molecular beam epitaxy: molecular beam epitaxial growth method) technique or a low temperature CVD technique which employs a high degree of vacuum has been proposed in recent years, and where this method is employed, an impurity concentration distribution having a so-called box shape wherein the tail portion of the base layer is small as seen in FIG. 2(b) is obtained. Actually, however, since the base impurity is diffused into the silicon substrate by heat treatment for emitter drive-in or some other heat treatment in the process of production which is performed after formation of the epitaxial base layer, it is impossible to fully eliminate the tail portion of the base. If such tail region of the base layer is present, this increases the base width and deteriorates the high frequency characteristic, and moreover also the Early's effect of the bipolar transistor becomes remarkable and the transistor characteristic is deteriorated. Here, the Early's effect signifies a phenomenon wherein, as the collector-base junction is reversely biased, the depletion layer on an interface of the base-collector junction is expanded and the effective base region length is decreased, and consequently, the gradient of injection minority carriers in the neutral base region becomes steeper and the collector current increases while the base current does not vary very much. A phenomenon wherein the current gain increases as the reverse bias to the collector-base junction is increased in this manner is generally called Early's effect. This phenomenon is argued, for example, in Minoru Nagata, "Very High Speed Bipolar Device", under the supervision of Takuo Sugano, Baifukan, pp.58–59.

As seen in FIG. 3, as the collector is biased with respect to the emitter, that is, as the reverse bias between the collector and the base increases, the collector current exhibits a great increase under a fixed base current. The Early voltage $V_A$ is-defined by a voltage at an intersecting point of an extension line (indicated by a broken line in FIG. 3) of a collector current to collector-emitter voltage characteristic. It can be said that, as the absolute value of the Early voltage $V_A$ increases, the influence of the Early's effect decreases. If the Early voltage drops, then a constant current characteristic in an active region of a current-voltage characteristic of a transistor cannot be obtained, resulting in such a drawback on a circuit that the characteristic of a constant-current source which is employed in the circuit.

In recent years, in order to improve the Early voltage of a bipolar transistor, a silicon type hetero junction bipolar transistor which employs, for the base, a material having a forbidden band narrower than that of single crystal silicon, for example, mixed crystal of silicon and germanium (hereinafter referred to briefly as SiGe layer) has been proposed in a document by D. L. Harame et al, IEDM Tech. Dig., 1993, pp.71–74.

In this transistor, the Ge concentration has, in an intrinsic base layer, a distribution such that it is lower on the emitter region side and higher on the collector side. For example, the Ge concentration has such an inclined concentration distribution that the content of Ge on the emitter side is 0% while the content of Ge on the collector side is 10 to 25%. Since electrons which are minority carriers are accelerated by a drift electric field produced from the inclined distribution of the Ge concentration, as the reverse bias between the collector and the base increases, the depletion layer of the base-collector junction is expanded. Thus, even if the effective base region width becomes short, the drift electric field prevents the slope of injected minority carriers distribution in the neutral base region from becoming steeper, thereby preventing a drop of the Early voltage.

However, the conventional methods of producing semiconductor devices such as a MOS transistor and a bipolar transistor described above have the following problems.

As described above, in order to form a source drain region of a small junction depth, heat treatment in the process of production after implantation is preferably performed at a temperature as low as possible so that an ion-implanted impurity may not be diffused as much as possible. On the other hand, in order to activate impurity ions to obtain a sufficient carrier concentration, heat treatment is preferably performed at a temperature as high as possible. From this, the heat treatment temperature naturally has an optimum range, and heat treatment is normally performed at a temperature of approximately 750° C. to 850° C. However, by a mere countermeasure of using a low temperature within such temperature range for heat treatment, it is very difficult to form a very shallow diffused layer having, for example, a junction depth of 0.1 µm or less because of an influence of the channeling phenomenon described above.

According to the method disclosed in Japanese Patent Laid-Open No. Hei 2-191341, although it is possible to prevent channeling in the vertical and horizontal directions by implanting ions of $Si^+$ or $Ge^+$ into a transistor formation region to form an amorphous region in advance, leak current by a second order defect is produced as a result of the formation of the amorphous region. It is very difficult to suppress this leak current. It is to be noted that a method of preventing an increase of the leak current by making the depth of the amorphous region great is disclosed in Japanese Patent Laid-Open No. Hei 2-191341. For example, it is disclosed that, by performing ion implantation three times using implantation energies of approximately 50 keV, 200 keV and 400 keV, an amorphous region of the depth of approximately 0.5 µm can be obtained. In this instance, however, a second order defect in a low energy condition (a condition to make a portion of a substrate around the surface into an amorphous state) like the following matters.

That is to say, although a second order defect introduced to the depth of approximately 0.5 µm with 400 keV does not make a cause of leak current since it is spaced by a sufficient distance away from the diffused layer, since another second order defect introduced with 50 keV is formed in the proximity of the surface, it makes it liable to produce leak current readily.

In the method of forming an epitaxial base layer of a bipolar transistor using the MBE technique or the low temperature CVD technique, a base impurity is diffused into a silicon substrate by heat treatment for emitter drive-in or some other heat treatment in the process of production which is performed after formation of the base layer, and consequently, it is difficult to realize a fully box-shaped impurity concentration distribution having no tail portion. As described hereinabove, if the base layer has a tail portion (that is, if the doping concentration of the base region is all most the same as that of the collector region), the drop of the Early voltage appears remarkably.

In the method wherein the Ge concentration distribution in a SiGe intrinsic base layer is set to an inclined concentration distribution wherein the Ge concentration is lower on the emitter region side and higher on the collector side, if it is intended to further improve the Early voltage of the bipolar transistor, then the Ge concentration slope must be made steeper. If the Ge concentration slope becomes very steep, then the amount of Ge contained in the entire base layer increases, and in this instance, if the base layer is formed in a thin film, then a high strain (strain of the layer) condition cannot be maintained and a defect is produced in the interference of the base-collector junction. For example, where an inclined concentration distribution wherein the content of Ge is 0% on the emitter side and 30 to 40% on the collector side is employed, a high strain (strain of the layer) condition cannot be maintained unless the base layer is formed with the film thickness of, for example, less than 50 nm. Consequently, a film thickness with which a high strain condition can be maintained and an optimum base layer film thickness with which a predetermined emitter-collector break-down voltage property is obtained do not coincide with each other.

SUMMARY OF THE INVENTION

It is a first object of the present invention to provide a semiconductor device which, solving the problems described above, does not allow production of leak current or a drop of the Early voltage and includes a diffused layer having a reduced depth.

It is a second object of the present invention to provide a method of producing the semiconductor device just described.

In order to attain the first object described above, according to an aspect of the present invention, there is provided a semiconductor device wherein, on a semiconductor substrate of a first conduction type, a silicon layer containing an impurity of a second conduction type is formed, comprising a spacer layer provided under the silicon layer and formed from a single crystal silicon layer containing germanium.

Preferably, in the semiconductor device, the concentration of the impurity of the second conduction type contained at least in part of the silicon layer is equal to or higher than $1 \times 10^{18}$ $cm^{-3}$, and the content of germanium in the spacer layer is 10% to 15%.

The concentration distribution of germanium in the spacer layer may be an inclined concentration distribution wherein the concentration is lower on the silicon layer side than on the semiconductor substrate side.

In any of the semiconductor devices described above, a source drain layer of a MOS transistor is formed in the silicon layer or the silicon layer is an active base layer of a bipolar transistor.

In order to attain the second object described above, according to the present invention, there is provided a first method of producing a semiconductor device wherein, on a semiconductor substrate of a first conduction type, a silicon layer containing an impurity of a second conduction type is formed, wherein a spacer layer formed from a single crystal silicon layer containing germanium and a silicon layer are successively formed on the semiconductor substrate of the first conduction type, and then a diffused region of the impurity of the second conduction type is formed in the silicon layer by ion implantation.

According to the present invention, there is provided a second method of producing a semiconductor device wherein, on a semiconductor substrate of a first conduction type, a silicon layer containing an, impurity of a second conduction type is formed, comprising the first step of successively forming a spacer layer formed from a single crystal silicon layer containing germanium and a silicon layer on the semiconductor substrate of the first conduction type, the second step of forming a gate oxide film of a predetermined thickness at a portion of the silicon layer formed by the first step which makes an active region, the third step of forming a gate electrode of a predetermined pattern on the gate oxide film formed by the second step, and the fourth step of implanting ions of an impurity of the second conduction type using the gate electrode formed by the third step as a mask for ion implantation and performing annealing in a nitrogen atmosphere of a predetermined temperature to form a source drain region in the silicon layer.

According to the present invention, there is provided a third method of producing a semiconductor device wherein, on a semiconductor substrate of a first conduction type, a silicon layer containing an impurity of a second conduction type is formed, comprising the first step of successively forming, on the semiconductor substrate of the first conduction type, a buried layer of the second conduction type and a collector layer of the second conduction type, the second step of forming a first oxide film of a predetermined thickness on the collector layer of the second conduction type formed by the first step, implanting ions of an impurity of the second conduction type into a predetermined region in the collector layer of the second conduction type and performing annealing in a nitrogen atmosphere of a predetermined temperature to form a collector leading out diffused layer, the third step of removing the oxide film in a base region from within the first oxide film formed by the second step and successively forming a spacer layer formed from a single crystal silicon layer containing germanium and a silicon layer on the base region of the collector layer of the second conduction type whose surface is exposed, the fourth step of successively forming a polycrystalline silicon layer of the first conduction type and a second oxide film of a predetermined thickness over the entire area and patterning the polycrystalline silicon layer of the first conduction type and the second oxide film into a predetermined shape to form a base leading out: electrode, the fifth step of forming a polycrystalline silicon layer of a predetermined thickness containing an impurity of the second conduction type over the entire area and patterning the polycrystalline silicon layer into a predetermined shape to form an emitter electrode, and the sixth step of diffusing an impurity of the first conduction type into the silicon layer to form an external base diffused layer and diffusing an impurity of the second conduction type into the silicon layer to form an emitter diffused layer in the active base layer.

According to the present invention described above, since the spacer layer containing germanium is provided under the silicon layer, when a diffused layer of an impurity of the second conduction type is to be formed in the silicon layer, the impurity of the second conduction type is not diffused into the spacer layer or the semiconductor substrate of the first conduction type under the spacer layer by a channeling phenomenon or some other phenomenon, and diffusion in the widthwise direction is limited by the spacer layer. The first reason for this is that channeling is not likely to occur because Ge is contained by a small amount in the SiGe spacer layer and a strain is produced from a difference in lattice constant between Ge atoms and Si atoms. The second reason is that the diffusion dose of the impurity in the SiGe sparer layer is low as hereinafter described. Accordingly, the depth of the diffused layer is substantially equal to the film thickness of the silicon layer formed on the spacer layer.

Further, in the present invention, since an amorphous region need not be formed as different from a conventional device, leak current is not produced. Further, since the impurity is not distributed into a region deeper than the region to which it is limited by the spacer layer even by heat treatment for emitter drive-in or some other heat treatment in the process of production which is performed after the base layer is formed, the Early voltage does not drop.

As described above, according to the present invention, since the depth of the diffused layer formed by introduction of an impurity of the second conduction type is limited by the spacer layer, there is an effect that a diffused layer of a shallow depth which could not conventionally have been achieved can be formed and a high Early voltage can be realized. Particularly where the concentration distribution of germanium in the spacer layer is an inclined concentration distribution wherein the concentration is lower on the silicon layer side than on the semiconductor substrate side, further improvement of the Early voltage can be achieved.

Further, where a source drain layer of a MOS transistor is formed in the silicon layer, a MOS transistor wherein the depth of the source drain diffused layer is very small and the capacitance of the source drain junction is reduced can be provided.

Where the silicon layer is an active base layer of a bipolar transistor, a bipolar transistor wherein the thickness of the active base layer is very small and the capacitance of the base-collector junction can be reduced and besides a high Early voltage is realized can be provided.

BRIEF DESCRIPTION OF THE DRAWINGS

In he accompanying drawings:

FIG. 1(a) is a schematic sectional view of a semiconductor device in which an amorphous region is formed, and FIG. 1(b) is a schematic sectional view of the semiconductor device in which a source drain diffused layer is formed in the amorphous region;

FIGS. 12(a) to 12(e) are sectional views showing different steps of production of the semiconductor device shown in FIG. 8.

DESCRIPTION OF THE PREFERRED EMBODIMENTS

Next, the present invention is described with reference to the drawings.

First Embodiment

Figure 2B:
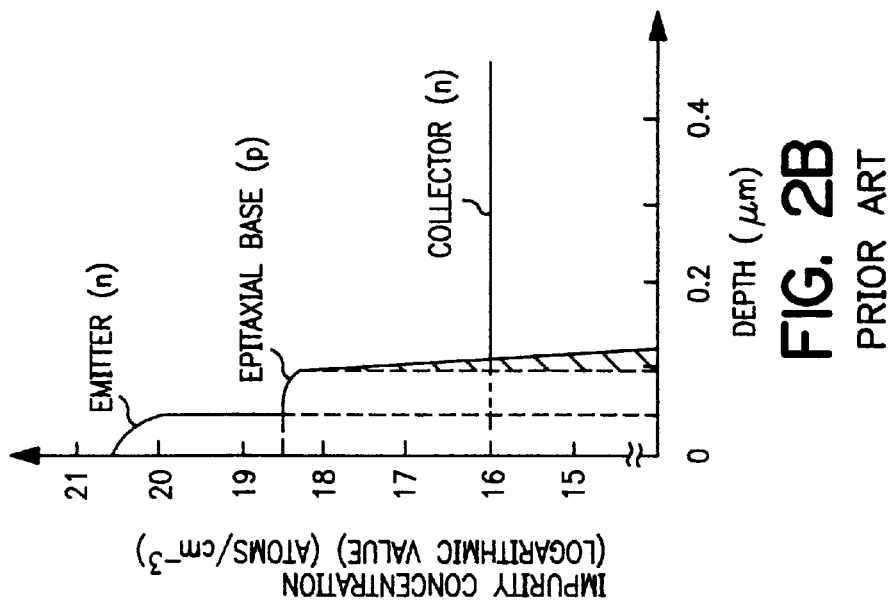
FIG. 2(b) is a graph illustrating an impurity distribution of a bipolar transistor base diffused layer when an epitaxial base layer is formed using an MBE technique or a low temperature CVD method which uses a high vacuum.
Figure 2A:
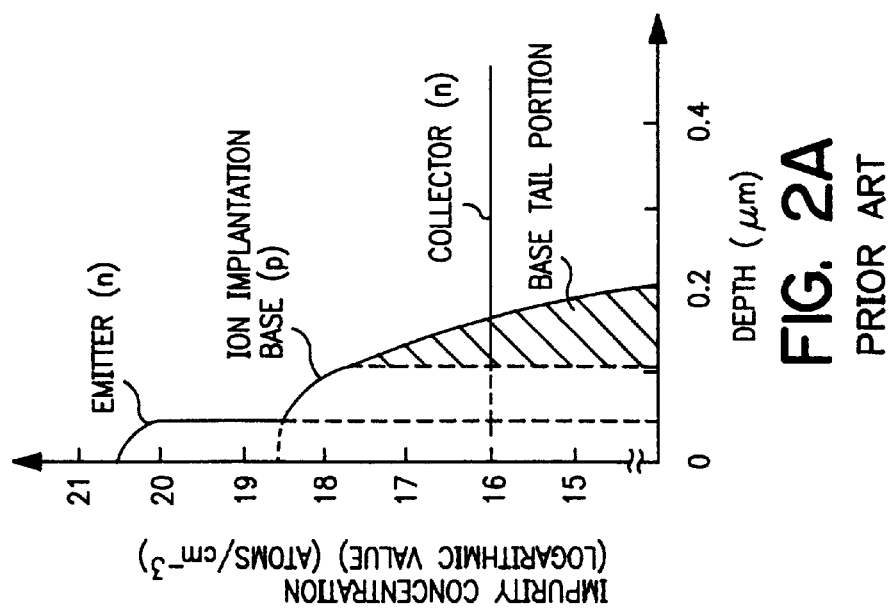
FIG. 2(a) is a graph illustrating an impurity distribution of a bipolar transistor base diffused layer when a method wherein the implantation energy is set low or another method wherein ions having a large mass number are used is taken.
Figure 3:
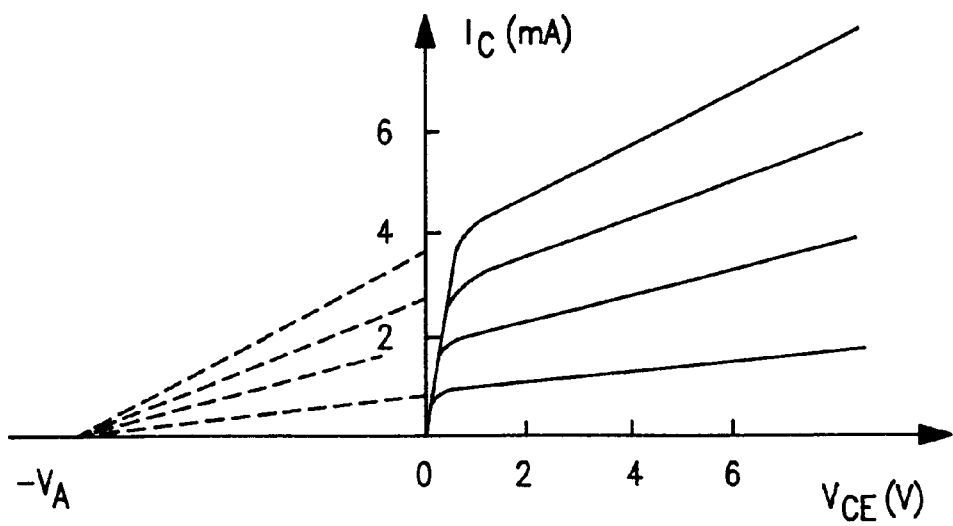
FIG. 3 is a graph showing a collector current to collector-emitter voltage characteristic of a conventional bipolar transistor.
Figure 4:
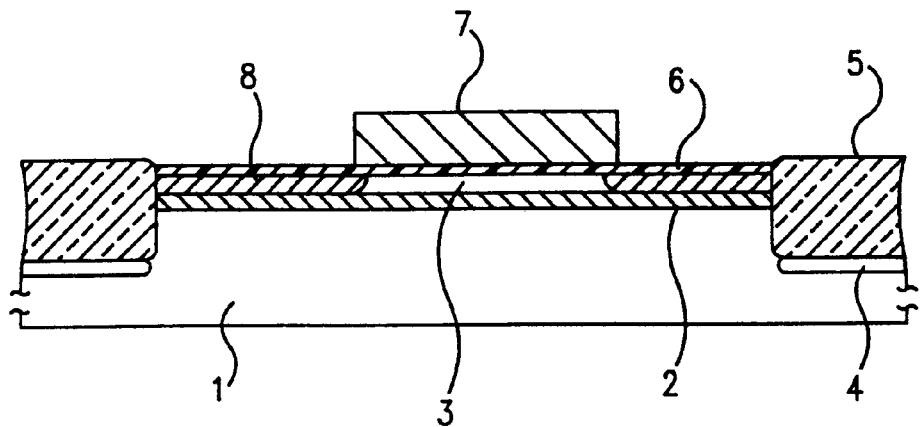
FIG. 4 is a sectional view of a structure of a first embodiment when a semiconductor device of the present invention is applied to a MOS transistor.

FIG. 4 is a sectional view of a structure of a first embodiment wherein a semiconductor device of the present invention is applied to a MOS transistor.

On N-type silicon substrate 1, SiGe spacer layer 2 and channel silicon layer 3 are successively formed using a low temperature epitaxial growth technique. Gate oxide film 6 of a predetermined thickness is formed on the surface of channel silicon layer 3, and gate electrode 7 of a predetermined shape is formed on this gate oxide film 6. Further, source drain region 8 which is a diffused layer is formed by ion implantation in channel silicon layer 3, thereby forming a 140S transistor. The thickness of channel silicon layer 3 is, for example, 10 to 100 nm, and the thickness of SiGe spacer layer 2 is, for example, 10 to 100 nm and the germanium content in SiGe spacer layer 2 is, for example, 10%. When the temperature of heat treatment in the process of production after SiGe spacer layer 2 is formed is higher than 800° C., in order to maintain the strain of the SiGe layer, preferably the thickness of the spacer is smaller than 100 nm and the content of Ge is lower than 15%.

Figure 5:
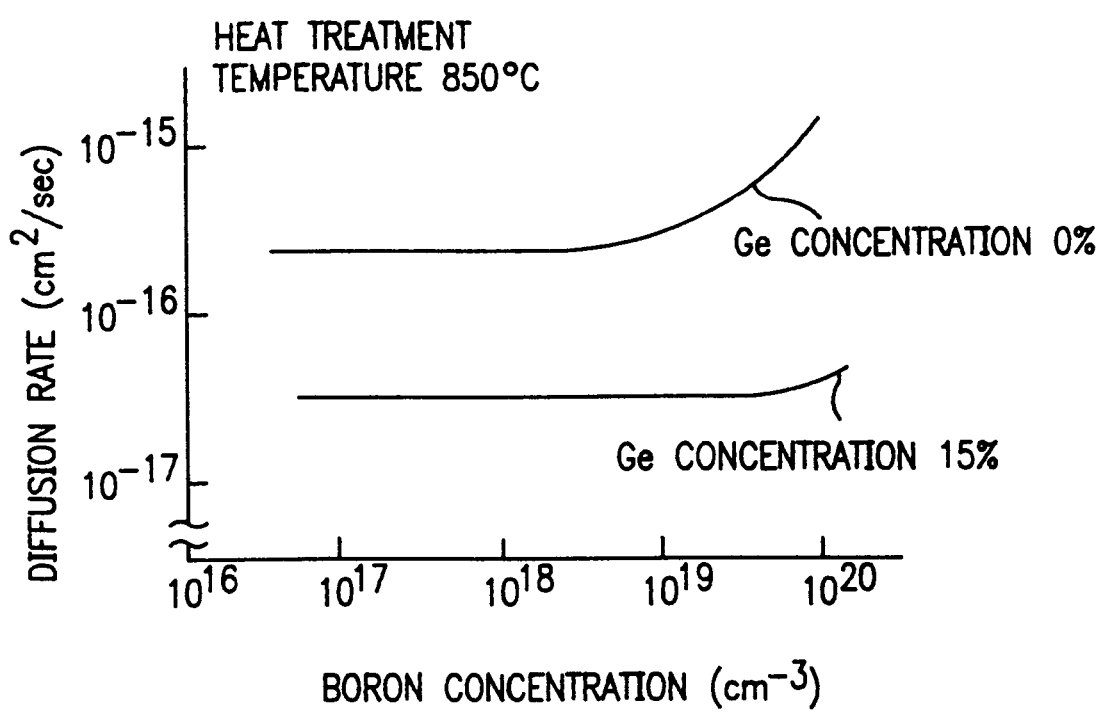
FIG. 5 is a graph illustrating a difference in boron diffusion dose depending upon whether Ge is present or not.

FIG. 5 is a graph showing a result of comparison between relationships of the boron concentration and the boron diffusion dose wherein the content of Ge is 15% and 0% when the temperature of heat treatment is 850° C. As can be seen from FIG. 5, where the content of Ge is 15%, a lower diffusion dose is exhibited, and even if the boron concentration increases, the diffusion dose does not increase sharply.

In a semiconductor device having such a structure as described above, since SiGe spacer layer 2 is grown to the thickness of 10 to 100 nm under channel silicon layer 3, even if heat treatment in the process of production after source drain region 8 is formed in channel silicon layer 3 is performed, for example, at a temperature of 800 to 900° C. for approximately 30 minutes, diffusion of the impurity in the depthwise direction is suppressed, and a shallow junction can be formed. In particular, in the present semiconductor device, source drain region 8 has a very small depth of 10 to 100 nm which is substantially equal to the thickness of channel silicon layer 3.

It is to be noted that, while the semiconductor device described above has a configuration of a p-channel MOS transistor, the configuration of it is not limited to this and may be that of an n-channel MOS transistor or a CMOS transistor.

Next, a method of producing the semiconductor device described above is described in detail. Here, a method of producing a p-channel MOS transistor is described.

FIGS. 6(a) to 6(d) are sectional views showing different steps of production of the semiconductor device shown in FIG. 4.

Figure 6A:
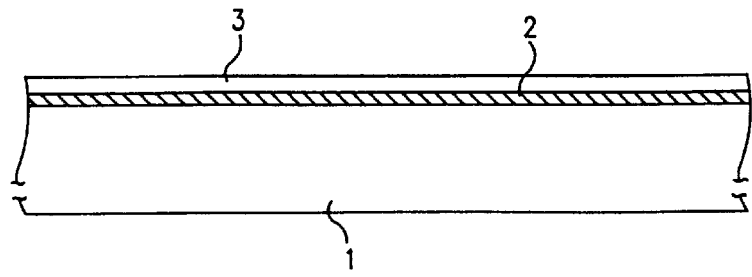
FIGS. 6(a) to 6(d) are sectional views showing different steps of production of the semiconductor device shown in FIG. 4.

First, (undoped) SiGe spacer layer 2 containing no impurity and channel silicon layer 3 are successively grown on the surface of N-type silicon substrate 1 as seen in FIG. 6(a) using a low temperature epitaxial growth method. SiGe spacer layer 2 is grown, for example, under the conditions of a temperature of 500 to 700° C., $GeH_4$ gas of 0.5 to 1.0 sccm and disilane gas of 0.5 to 1 sccm. Further, channel silicon layer 3 is grown, for example, under the conditions of a temperature of 500 to 700° C., disilane gas of 0.5 to 1 sccm and a boron concentration of $1 \times 10^{18} cm^{-3}$ or less (more preferably $1 \times 10^{18}$ to $1 \times 10^{15} cm^{-3}$).

Figure 6B:
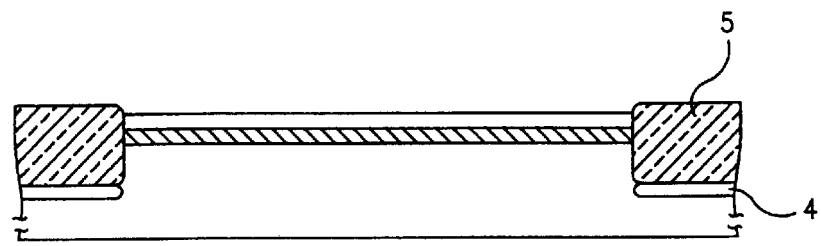
Figure 7A:
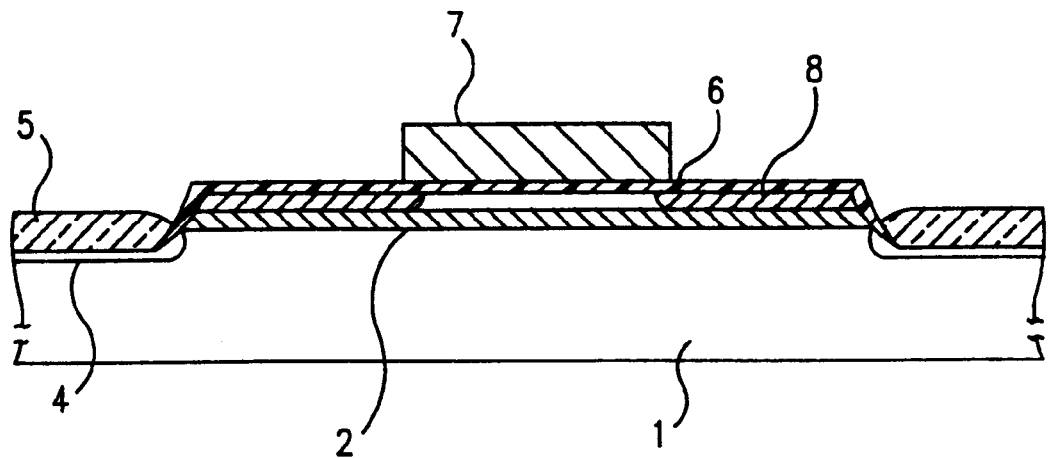
FIGS. 7(a) and 7(b) are sectional views showing different examples of a structure of the semiconductor device shown in FIG. 4.

Then, N-type channel stopper layer 4 is formed and isolation 5 in which an insulating film, for example, an oxide film, is buried in a groove of 0.5 to 1 μm deep is formed as seen in FIG. 6(b) by a known ion implantation method and a known groove isolation formation method, respectively. This isolation 5 may be formed alternatively by a known selective oxidation method. Or, SiGe spacer layer 2 and channel silicon layer 3 described above may be successively grown, after isolation 5 is formed on substrate 1, on the exposed surface of the substrate in a planned transistor formation region using a selective epitaxial growth method (refer to FIG. 7(a) ).

It is to be noted that, in the present embodiment, the threshold voltage control of the MOS transistor is performed with channel silicon layer 3 which contains an impurity. This channel silicon layer 3 may alternatively be formed by introducing an impurity by ion implantation after an undoped silicon film which does not contain an impurity is grown.

Figure 6C:
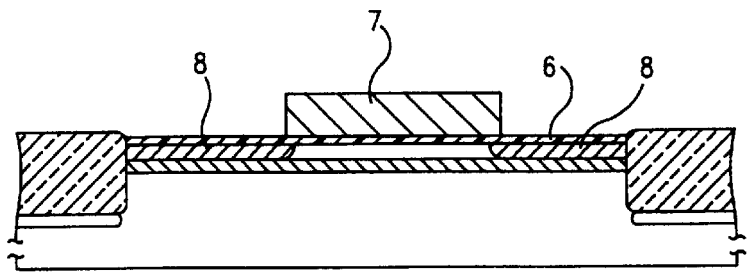

After channel stopper layer 4 and isolation 5 are formed, gate oxide film 6 of 5 to 15 nm thick is formed in a portion which makes an active area of a MOS transistor as seen in FIG. 6(c). Further, after ion implantation for adjustment of the threshold voltage of the MOS transistor is performed, a polycrystalline silicon film of 200 nm thick is deposited using a known CVD method, and an N-type impurity such as phosphor is introduced using thermal diffusion or ion implantation, whereafter the polycrystalline silicon film is worked by photo-etching to form gate electrode 7. Here, the polycrystalline silicon film may be replaced by a polycide film which is a composite film of a metal silicide film and a polycrystalline silicon film. Or, introduction of an impurity into the polycrystalline silicon film may serve also as ion implantation for formation of a source drain region which will be hereinafter described.

After gate electrode 7 is formed, P-type impurity ions of boron, $BF_2$ or the like are implanted by an implantation dose of $1 \times 10^{15}$ to $1 \times 10^{16} cm^{-2}$ with an implantation energy of 1 to 10 keV using gate electrode 7 as a mask for ion implantation, and then annealing is performed in a nitrogen atmosphere at a temperature around 900° C. to form P-type source drain region 8. By the steps described above, a structure shown in the sectional view of FIG. 6(c) is formed. It is to be noted that source drain region 8 may be formed alternatively by introducing, after silicon layer 14 or a polycrystalline silicon film is formed in a planned source drain formation region using a selective epitaxial growth method, the impurity of the source drain into silicon layer 14 or the polycrystalline silicon layer and then performing annealing in a nitrogen atmosphere to diffuse the impurity into channel silicon layer 3.

Figure 7B:
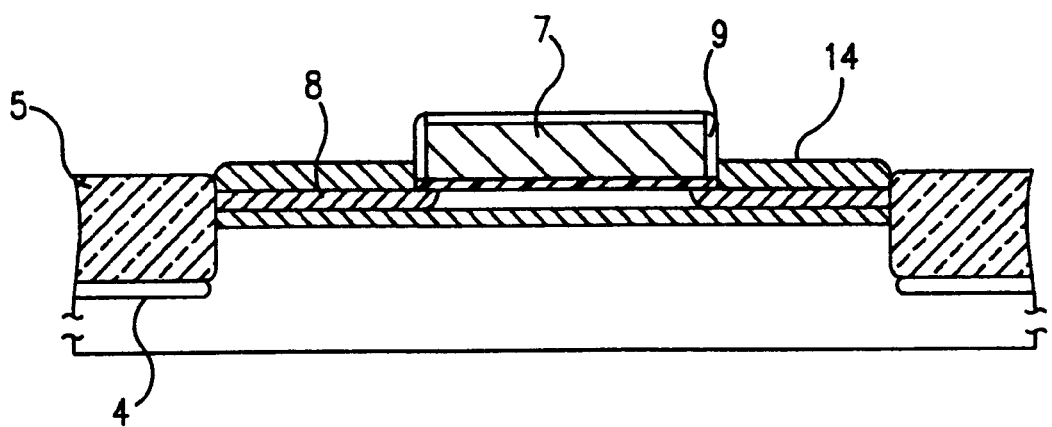

Referring to FIG. 7(b), reference numeral 9 denotes a side wall insulating film. Employment of this structure increases the effective depth of the source drain (that is, the effective depth of the source drain is the sum of the depths of silicon layer 14 and source drain region 8) and can further reduce the source drain resistance. Further, while, in the present embodiment, the source drain structure of the MOS transistor has a single drain structure, it may alternatively have an LDD (Lightly Doped Drain) structure. The LDD structure signifies a structure wherein the impurity concentrations of end portions of the source and drain regions are set low in order to moderate electric fields to be produced between the source and the gate and between the drain and the gate.

Figure 6D:
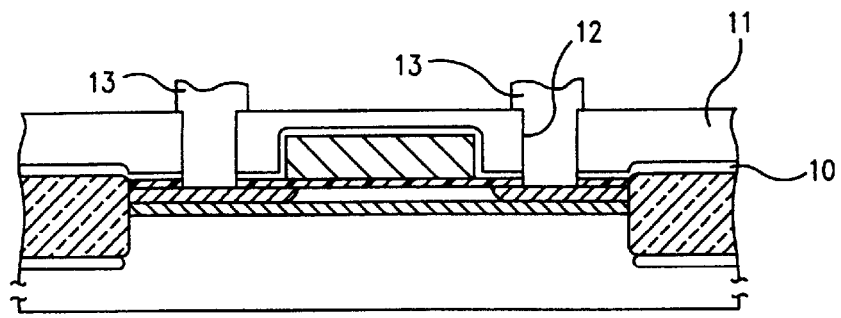

After source drain region 8 having an impurity concentration of approximately $1 \times 10^{18}$ to $1 \times 10^{20} cm^{-3}$ is formed, oxide film 10 of 50 to 100 nm thick and boron silicate glass (BPSG) 11 of 500 to 600 nm thick are successively deposited by a known CVD method, and then, after an inter-layer insulating film is formed, annealing is performed in a nitrogen atmosphere of 850 to 950° C., whereafter contact hole 12 and wiring 13 are formed by known production methods to complete a sectional view of FIG. 6(d).

In the semiconductor device of the first embodiment of the present invention applied to the MOS transistor described above, by providing a silicon layer containing germanium under a silicon layer in which a source drain diffused layer having a high impurity concentration is formed, a very shallow diffused layer whose junction depth is smaller than 0.1 μm can be formed. Further, since the depth of the source drain diffused layer is reduced, the short channel effect of the transistor exhibits improvement by approximately 0.05 μm comparing with that of a conventional structure. In addition, since the depletion layer from the source drain extends toward the spacer layer side where the thickness of the undoped SiGe spacer layer which does not contain an impurity is 100 nm, the source drain junction capacitance can be reduced by approximately 10 to 30% comparing with that of a conventional structure.

Second Embodiment

Figure 8:
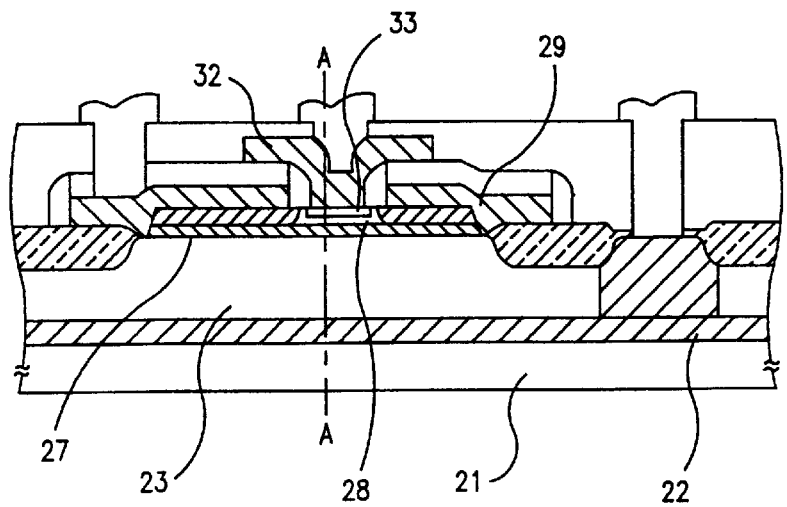
FIG. 8 is a sectional view of a structure of a second embodiment wherein a semiconductor device of the present invention is applied to a bipolar transistor.

FIG. 8 is a sectional view of a structure of a second embodiment wherein a semiconductor device of the present invention is applied to an NPN bipolar transistor.

Referring to FIG. 8, reference numeral 21 denotes a P-type silicon substrate, 22 a high concentration N-type buried layer, 23 a Si collector layer (N-type epitaxial layer), 27 a SiGe spacer layer containing an N-type impurity, 28 a P-type Si base layer (silicon intrinsic base layer) grown on SiGe spacer layer 27 by a selective epitaxial growth technique, 33 an N-type emitter diffused layer, 32 a polycrystalline silicon layer for leading out the emitter, and 29 a P-type polycrystalline silicon layer for externally leading out the base. An impurity concentration distribution in the widthwise direction and a germanium content of SiGe spacer layer 27 of the semiconductor device taken along line A—A of FIG. 8 are illustrated in FIG. 9.

Figure 9:
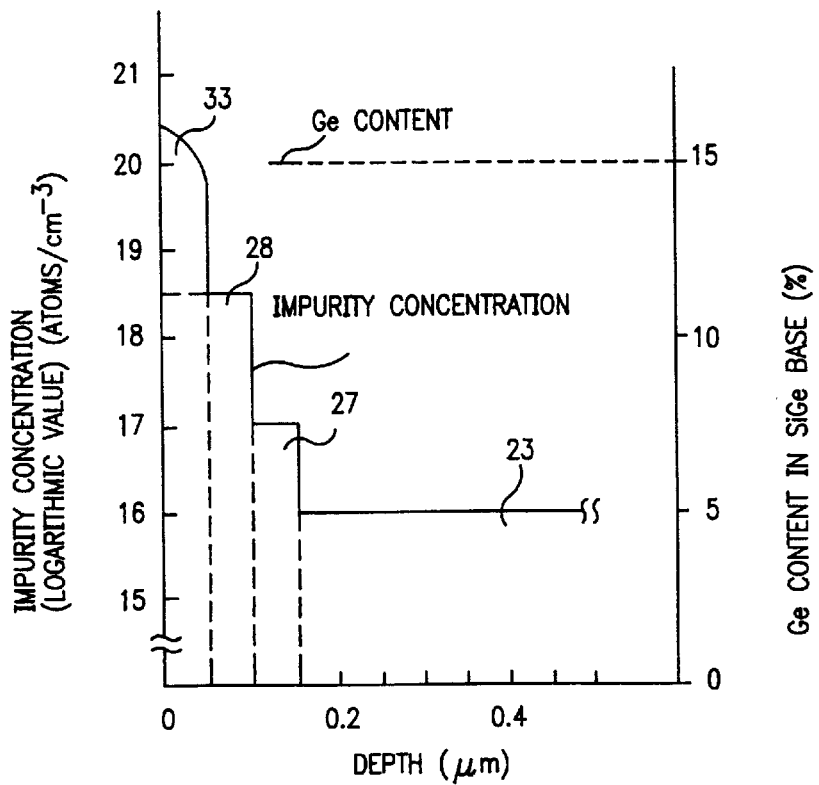
FIG. 9 is a graph illustrating an impurity concentration distribution in a depthwise direction and a Ge content of a SiGe spacer layer of the semiconductor device taken along line A—A of FIG. 8.

As seen in FIG. 9, in the semiconductor device of the present embodiment, N-type polycrystalline silicon layer 32 has a thickness of 200 to 300 nm and has an impurity concentration of, for example, $1\times10^{20}$ to $1\times10^{21}$ cm$^{-3}$, and N-type emitter diffused layer 33 has an impurity concentration of, for example, $1\times10^{20}$ to $1\times10^{21}$ cm$^3$ and has a depth of 40 to 50 nm. The effective thickness of P-type Si base layer (silicon intrinsic base layer) 28 which is an intrinsic base region immediately under emitter diffused layer 33 is 30 to 70 nm and the P-type impurity concentration of P-type Si base layer (silicon intrinsic base layer) 28 is, for example, $1\times10^{18}$ cm$^{-3}$ or more (more preferably, $2\times10^{18}$ to $1\times10^{19}$ cm$^{-3}$). The thickness of SiGe spacer layer 27 is 20 to 60 nm and the N-type impurity concentration of SiGe spacer layer 27 is, for example, $1\times10^{17}$ to $6\times10^{17}$ cm$^{-3}$. The thickness of Si collector layer 23 is 50 to 800 nm and the N-type impurity concentration of Si collector layer 23 is, for example, $1\times10^{16}$ to $6\times10^{16}$ cm$^{-3}$. The impurity concentration of N-type buried layer 22 is, for example, $5\times10^{19}$ to $1\times10^{21}$ cm$^{-3}$.

Figure 10:
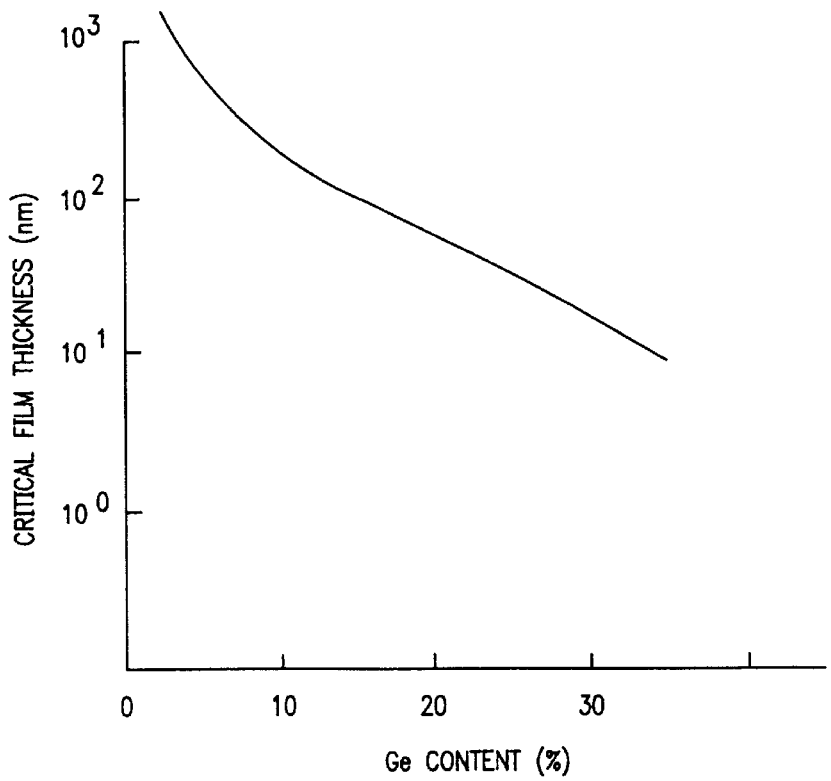
FIG. 10 is a graph illustrating a relationship between a Ge content in the SiGe spacer layer and a critical film thickness with which a defect occurs.

The content of germanium in SiGe spacer layer 27 mentioned above is, for example, 15%. It is to be noted that, as the germanium content of SiGe spacer layer 27 increases, the diffused layer of an impurity, for example, boron can be suppressed more, but if the germanium contents exceeds 20%, then a defect becomes liable to occur in the base layer because of the fact that silicon and germanium have different lattice coefficients and consequently the impurity diffusion dose increases conversely. Consequently, preferably the content of germanium in SiGe spacer layer 27 is set lower than 20% at the highest. Further, preferably the content of germanium is set to 10 to 15% when it is taken into consideration that heat treatment to be performed after formation of the spacer is performed at a high temperature. In this instance, since a defect becomes liable to occur if the layer is formed with a thickness greater than 100 nm, preferably the film thickness of SiGe spacer layer 27 is set to 10 to 60 nm. FIG. 10 illustrates a relationship between the germanium content in the SiGe film and a critical film thickness with which a defect occurs. As can be seen from FIG. 10, as the germanium content decreases lower than 5%, the critical film thickness increases suddenly.

Figure 11:
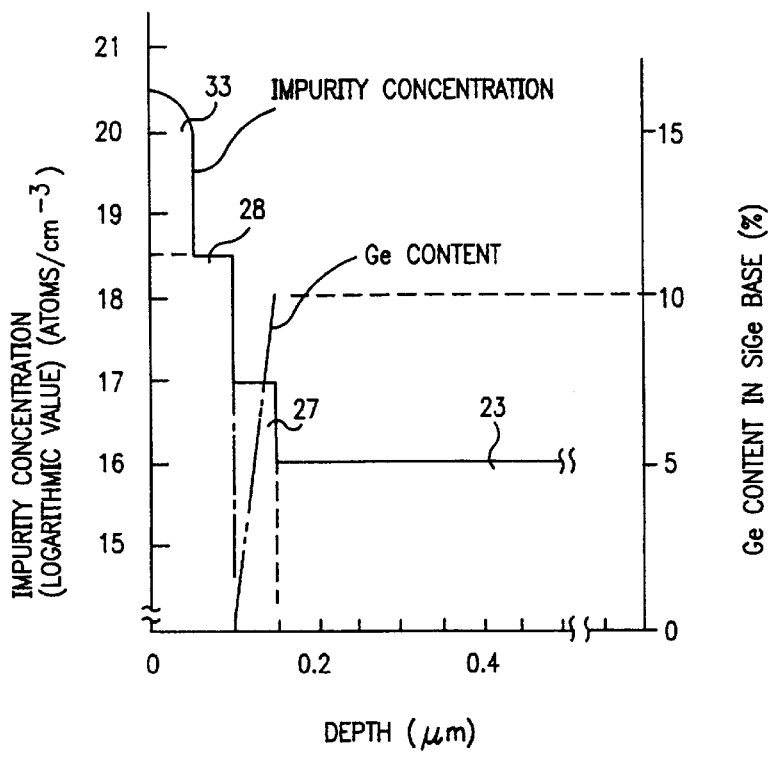
FIG. 11 is a graph illustrating an impurity concentration distribution in a depthwise direction and a Ge content of the SiGe spacer layer of the semiconductor device taken along line A—A of FIG. 8 when the Ge concentration distribution of the SiGe spacer layer is of the inclined type.

While, in the semiconductor device of the present embodiment, Ge in SiGe spacer layer 27 is contained uniformly, the concentration distribution of germanium in SiGe spacer layer 27 may alternatively be an inclined concentration distribution. For example, the concentration distribution may be set to such an inclined concentration distribution wherein the germanium content on the base layer side is 0% and the germanium content on the collector side is 10% as seen in FIG. 11. In this instance, even if heat treatment is performed at a high temperature and for a long period of time and the base impurity is diffused into SiGe spacer layer 27 until a base tail is formed, a drop of the Early voltage can be prevented by improving the mobility of minority carriers by a drift electric field in SiGe spacer layer 27.

Next, a method of producing the semiconductor device having such a construction as described above is described.

FIGS. 12(a) to 12(e) are sectional views illustrating different steps of production of the semiconductor device shown in FIG. 8.

First, N-type buried layer 22 and N-type Si collector layer (N-type epitaxial layer) 23 are successively formed over the entire area on P-type silicon substrate 21 as seen in FIG. 12(a). Then, isolation oxide film 24 of a thickness of 300 to 600 nm is selectively formed using a known method. In this instance, oxide film 26 is formed on the surface of Si collector layer (N-type epitaxial layer) 23. Then, ion implantation and succeeding annealing heat treatment at or around 900° C. are performed to form collector leading out diffused layer 25 so as to extend to N-type buried layer 22.

After collector leading out diffused layer 25 is formed, oxide film 26 on the base region is removed as seen in FIG. 12(b) using a known photo-etching method. Then, using a selective epitaxial growth method, SiGe spacer layer 27 and P-type Si base layer (silicon intrinsic base layer) 28 are successively grown on a base region in which the surface of Si collector layer (N-type epitaxial layer) 23 is exposed. SiGe Spacer layer 27 is grown, for example, under the conditions of a temperature of 500 to 700° C., GeH4 gas of 0.5 to 1.0 sccm, silane gas of 0.5 to 1 sccm and an N-type impurity concentration of $1\times10^{16}$ to $6\times10^{16}$ cm$^{-3}$. If an epitaxial technique which employs a low pressure CVD technique having ultra-high vacuum exhaust is used, then it is possible to cause germanium to be contained with a high degree of accuracy into a silicon film. Further, P-type Si base layer (silicon intrinsic base layer) 28 is grown, for example, under the conditions of a temperature of 500 to 700° C., silane gas of 0.5 to 1 sccm and a boron concentration of $10^{18}$ to $10^{19}$ cm$^{-3}$.

After SiGe spacer layer 27 and P-type Si base layer (silicon intrinsic base layer) 28 are formed, P-type polycrystalline silicon layer 29 of 100 to 300 nm containing boron and an inter-layer insulating film, for example, oxide film 30, of 100 to 300 nm thick are successively formed over the entire area as seen in FIG. 12(c). Then, they are patterned into base leading out electrode 29a of a predetermined shape, and side wall insulating film 31, of for example, 100 to 300 nm thick of a nitride film is formed by a known technique on an end face of base leading out electrode 29a.

After insulating film 31 is formed, polycrystalline silicon layer 32 containing an N-type impurity, for example, arsenic, is formed with a thickness of 100 to 200 nm as seen in FIG. 12(d) and then patterned using a photo-etching method to form emitter electrode 32a. Then, heat treatment of 850 to 950° C. is performed to form emitter diffused layer 33 in P-type Si base layer (silicon intrinsic base layer) 28. Thereupon, also external base diffused layer 34 is formed simultaneously.

After emitter diffused layer 33 and external base diffused layer 34 are formed, inter-layer insulating film 35 and electrodes 36b, 36c and 36e are formed by a known method as seen in FIG. 12(e), thereby completing a bipolar transistor.

Figure 13:
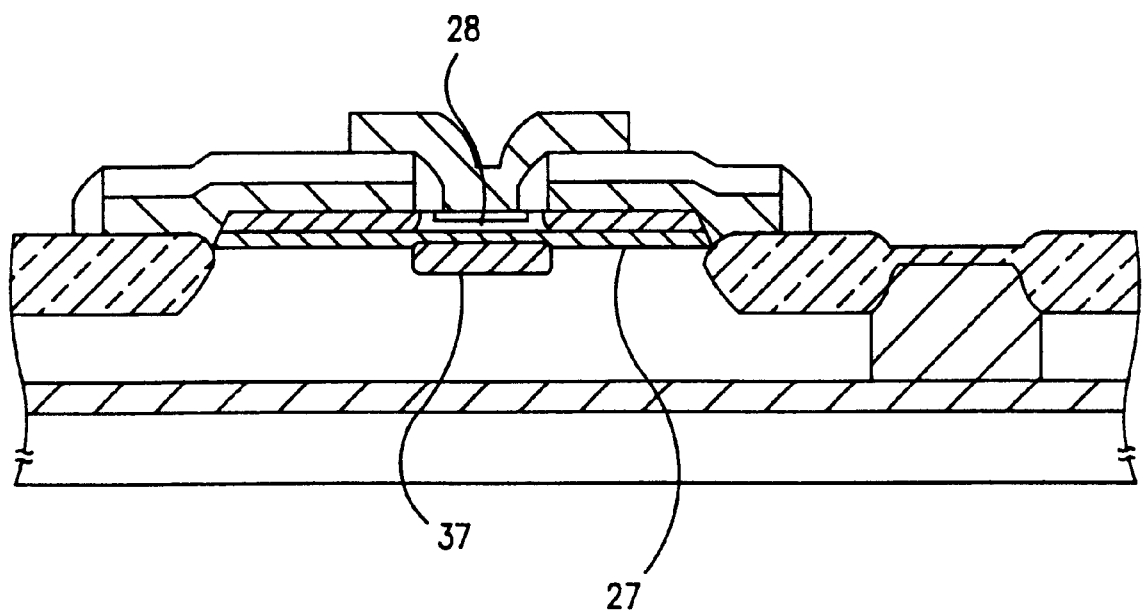
FIG. 13 is a sectional view showing another example of a structure relating to the semiconductor device shown in FIG. 8.

SiGe spacer layer 27 may be of an undoped type which does not contain an impurity or of a doped type which contains an N-type impurity by $1 \times 10^{16}$ to $1 \times 10^{17}$ cm$^{-3}$. Where SiGe spacer layer 27 which does not contain an impurity is employed, a depletion layer is liable to extend in a reversely biased base-collector junction, and consequently, the brake-down voltage property between the base and the collector or between the collector and the emitter can be improved. On the other hand, where SiGe spacer layer 27 which contains an N-type impurity is employed, since the Kirk effect (a phenomenon wherein the cutoff frequency of a bipolar transistor decreases as the collector current of the bipolar transistor increases) in a high collector-injection current condition can be suppressed, the cutoff frequency can be improved. Or, SiGe spacer layer 27 may be formed such that, after an undoped SiGe layer which does not contain an impurity is grown and an emitter opening is formed in the undoped SiGe layer as seen in FIG. 13, ions of an N-type impurity such as, for example, phosphor, are implanted into a silicon collector portion just below an emitter region including SiGe spacer layer 27 under the conditions of an acceleration energy of 200 to 300 keV and an implantation dose of $1 \times 10^{12}$ to $1 \times 10^{13}$/cm$^{-2}$ to form pedestal collector 37. If this method is used, then since a depletion layer becomes liable to extend in a reversely biased base collector junction portion, the parasitic capacitance between the base and the collector can be reduced, and besides the Kirk effect operating at a high collector current density can be suppressed.

As described above, in the semiconductor device of the second embodiment applied to a bipolar transistor, since a SiGe spacer layer formed from a single crystal silicon layer containing germanium is provided between a base region and a collector region and diffusion of a base impurity is suppressed by this SiGe spacer layer, a shallow base diffused layer and a high Early voltage can be realized. Further, by setting the germanium concentration of the SiGe spacer layer so as to have an inclined distribution wherein it is lower on the base region side and higher on the collector side, the Early voltage can be further improved. The Early voltage is improved to 40 to 60 V by application of the present invention whereas it conventionally is 20 to 30 V.

Further, since, in the present embodiment, the SiGe spacer layer is present under the base layer, even if heat treatment is performed after the base layer is formed, diffusion of the base impurity into this silicon substrate can be suppressed. Consequently, a box-shaped impurity concentration distribution free from a tail portion of the base layer is obtained. Accordingly, with the present embodiment, the Early voltage is improved remarkably.

What is claimed is:

1. A semiconductor device comprising:
    a semiconductor substrate, a spacer layer formed from a single crystal silicon layer containing germanium, formed on said semiconductor layer;
    a single crystal silicon layer of a first conduction type, formed directly on said spacer layer, and
    semiconductor regions of a second conduction type of opposite type to the first conduction type, formed on opposite sides of the silicon layer and directly on said spacer layer.

2. A semiconductor device as claimed in claim 1, wherein the impurity concentration in the semiconductor regions of the second conduction type is higher than the impurity concentration in the single crystal silicon layer among the semiconductor regions, and the content of germanium in said spacer layer is 10% to 15%.

3. A semiconductor device as claimed in claim 2, wherein the semiconductor regions of the second conduction type constitute source and drain regions of a MOS transistor, and the single crystal silicon layer among the semiconductor regions constitutes a channel region.

4. A semiconductor device as claimed in claim 2, wherein the semiconductor regions of the second conduction type constitute an external base region of a bipolar transistor, and the single crystal silicon layer constitutes an intrinsic base region of a bipolar transistor.

5. A semiconductor device as claimed in claim 1, wherein the concentration distribution of germanium in said spacer layer is an inclined concentration distribution wherein the concentration is lower on the silicon layer side than on the semiconductor substrate side.

6. A semiconductor device as claimed in claim 5, wherein the semiconductor regions of the second conduction constitute source and drain regions of a MOS transistor, and the single crystal silicon layer among the semiconductor regions constitutes a channel region.

7. A semiconductor device as claimed in claim 5, wherein the semiconductor regions of the second conduction type constitute an external base region of a bipolar transistor, and the single crystal silicon layer constitutes an intrinsic base region of a bipolar transistor.

8. A semiconductor device as claimed in claim 1, wherein the semiconductor regions of the second conduction type constitute source and drain regions of a MOS transistor and the single crystal silicon layer among the semiconductor regions constitutes a channel region.

9. A semiconductor device as claimed in claim 1, wherein the semiconductor regions of the second conduction type constitute an external base region of a bipolar transistor, and the single crystal silicon layer constitutes an intrinsic base region of a bipolar transistor.

10. A semiconductor device comprising a semiconductor substrate of a first conduction type having a silicon layer containing an impurity of a second conduction type formed thereon,
    a spacer layer directly under said silicon layer and formed from a single crystal silicon layer containing germanium, wherein the concentration distribution of germanium in said spacer layer is in an inclined concentration distribution wherein the concentration is lower on the silicon layer side than on the semiconductor substrate side; and semiconductor regions of a second conduction type of opposite type to the first conduction type, formed on opposite sides of the silicon layer and directly on said spacer layer.

11. A semiconductor device as claimed in claim 10, wherein the concentration of the impurity of the second conduction type contained at least in part of said silicon layer is equal to or higher than $1 \times 10^{18}$ cm$^{-3}$, and the content of germanium in said spacer layer is 10% to 15%.

12. A semiconductor device as claimed in claim 11, wherein a source drain layer of a MOS transistor is formed in said silicon layer.

13. A semiconductor device as claimed in claim 11, wherein said silicon layer constitutes an active base layer of a bipolar transistor.

14. A semiconductor device as claimed in 10, wherein a source drain layer of a MOS transistor is formed in said silicon layer.

15. A semiconductor device as claimed in 10, wherein said silicon layer constitutes an active base layer of a bipolar transistor.

16. A semiconductor device as claimed in claim 10, wherein a source drain layer of a MOS transistor is formed in said silicon layer.

17. A semiconductor device as claimed in claim 10, wherein said silicon layer constitutes an active base layer of a bipolar transistor.

* * * * *